United States Patent
Smith et al.

(10) Patent No.: US 9,843,297 B2
(45) Date of Patent: Dec. 12, 2017

(54) BALANCED DIFFERENTIAL TRANSIMPEDANCE AMPLIFIER WITH SINGLE ENDED INPUT AND BALANCING METHOD

(71) Applicant: COSEMI TECHNOLOGIES, INC., Irvine, CA (US)

(72) Inventors: Robert Monroe Smith, Phoenix, AZ (US); Charles Phillip McClay, Fountain Hills, AZ (US)

(73) Assignee: Cosemi Technologies, Inc., Irvine, CA (US)

( * ) Notice: Subject to any disclaimer, the term of this patent is extended or adjusted under 35 U.S.C. 154(b) by 0 days.

(21) Appl. No.: 14/814,080

(22) Filed: Jul. 30, 2015

(65) Prior Publication Data

US 2016/0294336 A1    Oct. 6, 2016

Related U.S. Application Data

(60) Provisional application No. 62/142,558, filed on Apr. 3, 2015.

(51) Int. Cl.
*H03F 3/45*    (2006.01)
*H03F 3/08*    (2006.01)
(Continued)

(52) U.S. Cl.
CPC ............. *H03F 1/56* (2013.01); *H03F 1/0205* (2013.01); *H03F 1/083* (2013.01); *H03F 3/08* (2013.01);
(Continued)

(58) Field of Classification Search
CPC . H03F 1/56; H03F 1/0205; H03F 3/08; H03F 3/45076; H03F 2200/36; H03F 2203/45152
(Continued)

(56) References Cited

U.S. PATENT DOCUMENTS 6,344,651 B1 *  2/2002  Woolaway ................ G01J 5/24
                                            250/332
6,639,473 B1 * 10/2003  Kobayashi ............... H03F 3/08
                                            250/214 A
(Continued)

FOREIGN PATENT DOCUMENTS

DE    2720614 A1    11/1978
EP    1011193 A1 *  6/2000  ............... H03F 3/08

OTHER PUBLICATIONS

Mohan et al., "Bandwidth Extension in CMOS with Optimized On-Chip Inductors", IEEE Journal of Solid-state Circuits, vol. 35, No. 3, Mar. 2000, pp. 346-355.*

*Primary Examiner* — Steven J Mottola
*Assistant Examiner* — Hafizur Rahman
(74) *Attorney, Agent, or Firm* — Loza & Loza, LLP; George Fountain

(57) ABSTRACT

A balanced differential transimpedance amplifier with a single-ended input operational over a wide variation in the dynamic range of input signals. A threshold circuit is employed to either or a combination of (1) generate a varying decision threshold to ensure a proper slicing over a wide range of input current signal levels; and (2) generate a bias current and voltage applied to an input of a transimpedance stage to cancel out a dependence of the transimpedance stage voltage input on input current signal levels.

21 Claims, 11 Drawing Sheets

(51) Int. Cl.
    *H03F 1/56*  (2006.01)
    *H03F 1/02*  (2006.01)
    *H03F 1/08*  (2006.01)
(52) U.S. Cl.
    CPC ..... *H03F 3/45076* (2013.01); *H03F 3/45085* (2013.01); *H03F 3/45183* (2013.01); *H03F 3/45475* (2013.01); *H03F 3/45605* (2013.01); *H03F 3/45609* (2013.01); *H03F 3/45618* (2013.01); *H03F 3/45753* (2013.01); *H03F 3/45757* (2013.01); *H03F 3/45766* (2013.01); *H03F 3/45977* (2013.01); *H03F 3/45982* (2013.01); *H03F 3/45991* (2013.01); *H03F 2200/135* (2013.01); *H03F 2200/18* (2013.01); *H03F 2200/222* (2013.01); *H03F 2200/228* (2013.01); *H03F 2200/36* (2013.01); *H03F 2200/393* (2013.01); *H03F 2200/453* (2013.01); *H03F 2200/456* (2013.01); *H03F 2200/462* (2013.01); *H03F 2200/471* (2013.01); *H03F 2200/474* (2013.01); *H03F 2200/72* (2013.01); *H03F 2200/75* (2013.01); *H03F 2203/45036* (2013.01); *H03F 2203/45051* (2013.01); *H03F 2203/45114* (2013.01); *H03F 2203/45116* (2013.01); *H03F 2203/45138* (2013.01); *H03F 2203/45146* (2013.01); *H03F 2203/45152* (2013.01); *H03F 2203/45154* (2013.01); *H03F 2203/45166* (2013.01); *H03F 2203/45202* (2013.01); *H03F 2203/45208* (2013.01); *H03F 2203/45221* (2013.01); *H03F 2203/45276* (2013.01); *H03F 2203/45336* (2013.01); *H03F 2203/45374* (2013.01); *H03F 2203/45398* (2013.01); *H03F 2203/45528* (2013.01); *H03F 2203/45541* (2013.01); *H03F 2203/45556* (2013.01); *H03F 2203/45564* (2013.01); *H03F 2203/45566* (2013.01); *H03F 2203/45592* (2013.01); *H03F 2203/45594* (2013.01); *H03F 2203/45652* (2013.01); *H03F 2203/45682* (2013.01); *H03F 2203/45702* (2013.01)

(58) Field of Classification Search
    USPC .............. 330/9, 252–261, 288, 308, 301
    See application file for complete search history.

(56) References Cited

U.S. PATENT DOCUMENTS

| | | | | |
|---|---|---|---|---|
| 6,784,750 | B2* | 8/2004 | Chiou | H03F 3/087 |
| | | | | 330/308 |
| 6,809,596 | B2* | 10/2004 | Seetharaman | H03F 3/087 |
| | | | | 250/214 R |
| 2002/0089728 | A1 | 7/2002 | Kim | |
| 2005/0077925 | A1 | 4/2005 | Bernardson | |
| 2005/0218994 | A1* | 10/2005 | Guckenberger | H03F 3/08 |
| | | | | 330/308 |
| 2007/0286611 | A1* | 12/2007 | Weber | H04B 10/693 |
| | | | | 398/202 |
| 2011/0318015 | A1 | 12/2011 | Sugimoto | |
| 2014/0193164 | A1 | 7/2014 | Ide | |

* cited by examiner

US 9,843,297 B2

BALANCED DIFFERENTIAL TRANSIMPEDANCE AMPLIFIER WITH SINGLE ENDED INPUT AND BALANCING METHOD

CROSS REFERENCE TO RELATED APPLICATIONS

This application claims the benefit of U.S. Provisional Application No. 62/142,558, filed Apr. 3, 2015, the entire disclosure of which is incorporated herein by reference.

FIELD OF INVENTION

The subject matter herein generally relates to digital and analog circuits and signals and associated amplification techniques. In particular, the invention relates to a transimpedance amplifier for amplification of digital and analog signals.

BACKGROUND OF INVENTION

In various applications, it is desirable to perform amplification of electronic digital and analog signals. In optoelectronic applications, an input electronic signal may be a current generated, for example, by a photodiode. It may be further desired that an amplification process generate an output voltage signal. In order to generate an output voltage signal from an input current signal, a transimpedance amplifier may be utilized.

FIG. 1 depicts an exemplary schematic of a single-ended transimpedance amplifier using bipolar technology. Bipolar transistor 104 is biased via voltage sources 112 and 108. Resistor 114 in feedback configuration from output node 110 of bipolar transistor 104 to input node 116 of bipolar transistor 104 provides improved bandwidth and other amplification characteristics of bipolar transistor 104. Input current 102 is provided to bipolar transistor 104 at input node 116, which generates an output current (not shown) across resistor 106, which in turn generates an output voltage at node 110 across resistor 106.

Typically it is important that a transimpedance amplifier be able to amplify input signals spanning a wide frequency range and therefore that the amplifier exhibit a wide bandwidth. This is useful, for example, in high-speed digital baseband communications channels. One method for increasing the bandwidth of a transimpedance amplifier involves utilizing a current buffer at the input of the amplifier, which decouples the source impedance presented at the input of the amplifier from the feedback resistance, which tends to dominate the transimpedance amplifier's input impedance. A current buffer can significantly lower the transimpedance amplifier's input impedance, reducing the effect of capacitive loading at the input on the bandwidth of the amplifier. For example, U.S. Pat. No. 6,801,084 describes a single-ended transimpedance amplifier where the operational bandwidth of the amplifier is improved through the use of an input current buffer.

However, a single-ended transimpedance amplifier such as that shown in FIG. 1 is not in general well suited to applications where it is necessary to amplify input signals spanning a wide dynamic range, due to the output voltage swing at node 110 reducing the WE of device 104. As the input current, and corresponding output voltage become large, the WE of device 104 is no longer sufficient to maintain class A linear operation and distortion of the output waveform results.

SUMMARY OF INVENTION

Embodiments herein describe a balanced differential transimpedance amplifier with single ended input comprising a differential transimpedance stage, the differential transimpedance stage further comprising a first input and a second input; an input current buffer stage, wherein an output of the input current buffer stage is coupled to the first input of the transimpedance stage; and a threshold circuit for generating a threshold voltage for balancing the differential transimpedance stage, wherein an output of the threshold circuit is coupled to the second input of the transimpedance stage.

Embodiments herein further describe a balanced differential transimpedance amplifier with single ended input comprising a transimpedance stage comprising a differential pair, the differential pair further comprising a first input, a second input, a first output and a second output; an input current buffer stage, wherein an output of the input current buffer stage is coupled to the first input of the transimpedance stage; and a threshold circuit further comprising a voltage averaging circuit, wherein an output of the voltage averaging circuit is coupled to the second input of the transimpedance stage and the first and second outputs of the transimpedance stage are coupled to respective first and second inputs of the voltage averaging circuit.

Embodiments herein further describe a balanced differential transimpedance amplifier with singled ended input comprising a transimpedance stage comprising a differential pair, the differential pair further comprising a first input and a second input, an input current buffer comprising a first input and a second input, wherein an input current source is coupled to the first input of the input current buffer and an output of the input current buffer is coupled to the first input of the transimpedance stage; a current averaging circuit coupled in series between the input current source and the second input of the input current buffer, wherein the current averaging circuit receives the input current source and generates a direct current ("DC") time averaged signal based upon the input current source; and a threshold circuit, wherein an output of the threshold circuit is coupled to the second input of the transimpedance stage.

DETAILED DESCRIPTION

Described herein are exemplary embodiments of a balanced differential transimpedance amplifier with single ended input for amplifying input signals spanning a wide dynamic range.

In addition to bandwidth considerations, in certain applications such as optoelectronic systems, it is important that a transimpedance amplifier exhibit a wide dynamic range so that it can amplify input signals spanning a wide range of amplitudes. Further, due to the inherent signal integrity and transmission advantages of differential signals for applications such as high-speed data communications, it may be desirable to employ a differential transimpedance amplifier. For example, amplification of a fiber optic signal typically requires maximizing both dynamic range by extending small signal noise/bandwidth limitations as well as large signal overload capabilities relative to traditional topologies. This translates directly into reduced optical drive power requirements, which are desirable to decrease power consumption and increase reliability, and/or increased transmission distance.

Figure 1:
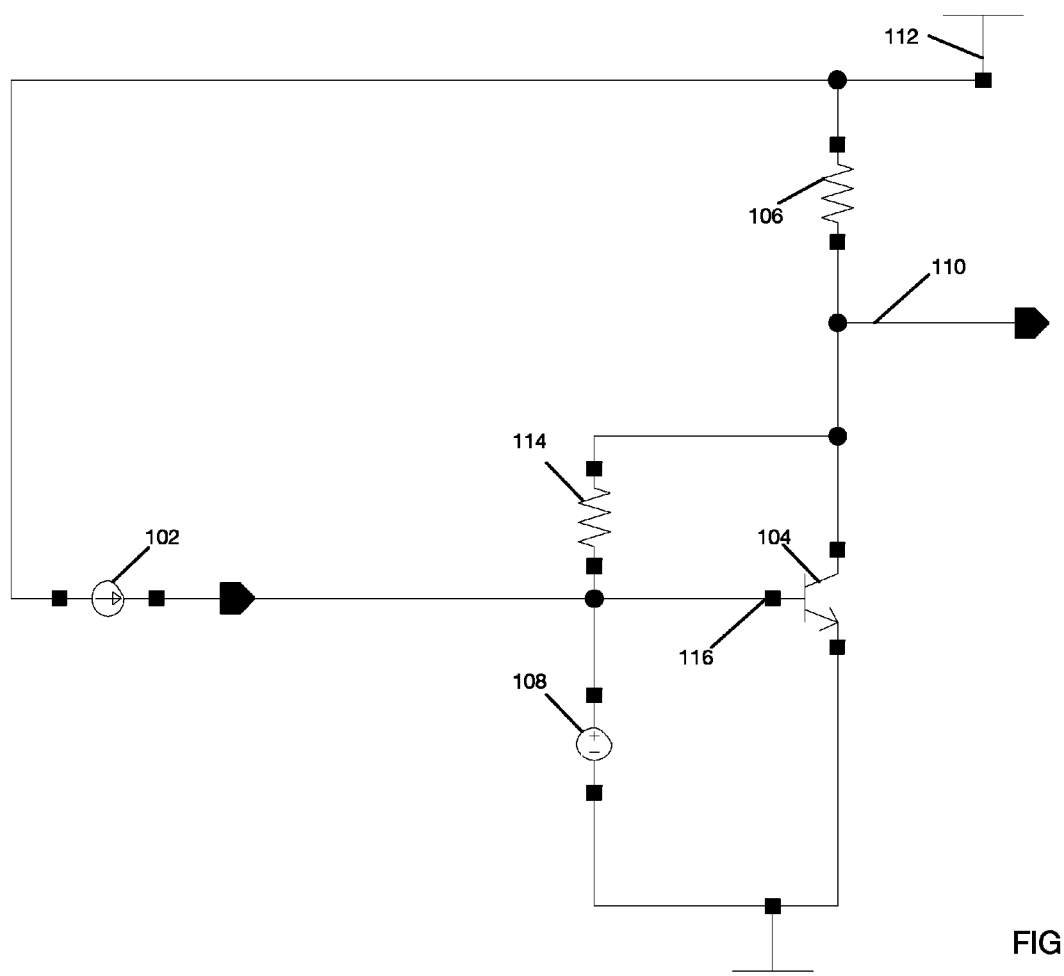
FIG. 1 depicts an exemplary schematic of a prior art single-ended transimpedance amplifier using bipolar technology.
Figure 2A:
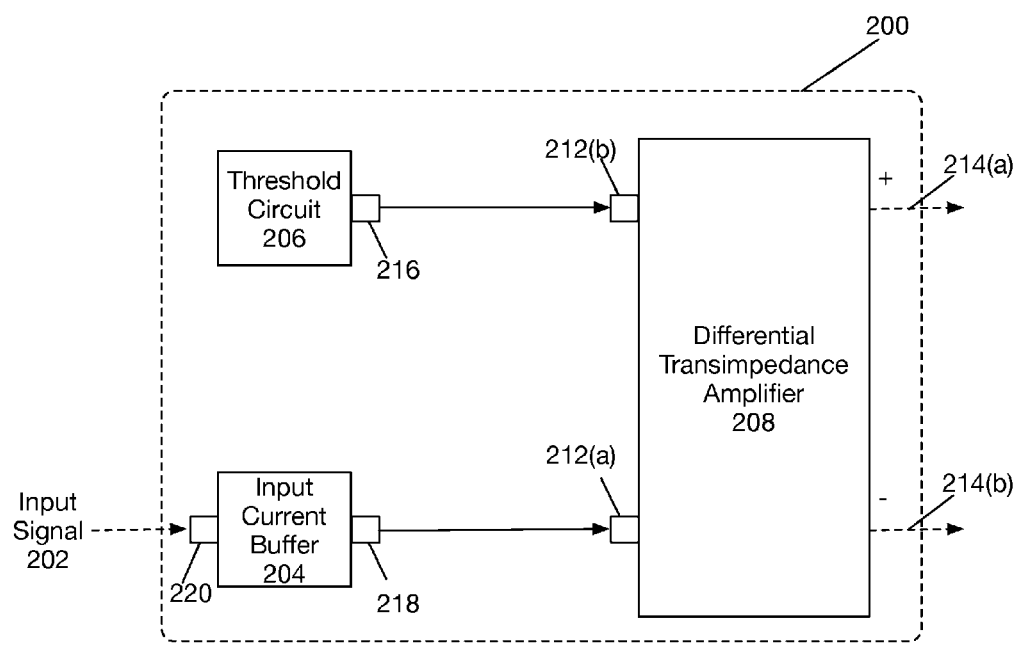
FIG. 2A is a block diagram of a balanced differential transimpedance amplifier with single ended input according to one embodiment.

FIG. 2A is a block diagram of a balanced differential transimpedance amplifier with single ended input according to one embodiment. Balanced differential transimpedance amplifier 200 may comprise input current buffer 204, threshold circuit 206 and differential transimpedance amplifier 208.

Differential transimpedance amplifier 208 receives a differential input signal (not shown in FIG. 2A) via first and second differential inputs 212(a) and 212(b) to generate differential output signal (not shown in FIG. 2A) via differential outputs 214(a) and 214(b). Typically differential transimpedance amplifier 208 may receive a single ended input current at differential input 212(a). Differential amplifier 208 may also receive a DC threshold voltage at differential input 212(b). According to one embodiment, the DC threshold voltage received at input 212(b) may be related to a DC average value of the input current applied to differential input 212(a). In response to input signals applied to inputs 212(a) and 212(b), differential transimpedance amplifier generates a differential output voltage via differential outputs 214(a) and 214(b).

Input current buffer 204 may improve bandwidth characteristics of differential transimpedance amplifier 208 by, for example, decoupling the input source impedance presented to the input of the amplifier from the input impedance of the amplifier itself. Referring to FIG. 2A, input current buffer 204 current receives input signal 202 via buffer input 220 and generates an output signal (not shown in FIG. 2A) via current buffer output 218. Current buffer output 218 is coupled to first differential input 212(a) of differential transimpedance amplifier 208.

In general, differential transimpedance amplifier 208 is unable to tolerate a wide dynamic range of input signals at input 212(a). According to one embodiment, in order to increase this operational range, threshold circuit 206 provides a balancing operation for differential transimpedance amplifier 208 by determining an optimum threshold for differential transimpedance amplifier 208 over a wide range of input signal levels. In particular, with respect to the embodiment depicted in FIG. 2A, threshold circuit 206 generates a fixed voltage signal with respect to the input signal, which is applied to input 212(b) of differential transimpedance amplifier 208.

Threshold circuit 206 generates an output signal (not shown in FIG. 2A) via threshold circuit output 216, which is provided to input 212(b) of differential transimpedance amplifier 208. Meanwhile, output signal of input current buffer (not shown in FIG. 2A) is provided to first input 212(a) of differential transimpedance amplifier 208.

Although as shown in the embodiment depicted in FIG. 2A, threshold circuit 206 may not receive any input signal as in the case, for example, where threshold circuit 206 generates a fixed voltage signal with respect to the input signal, in alternate embodiments, threshold circuit 206 may receive one or more input signals in order to perform a balancing operation for differential transimpedance amplifier 208. As described in various embodiments below, in order to perform this balancing operation, threshold circuit 206 may perform averaging of a current, voltage or some other signal either internal or external to balanced differential transimpedance amplifier 200.

For example, according to embodiments described herein, threshold circuit 206 may receive input signals comprising a current or voltage signal internal or external to balanced differential transimpedance amplifier 200. Examples of embodiments in which threshold circuit 206 receives one or more input signals are described with reference to FIGS. 3A-4B and 6A-6B.

Figure 2B:
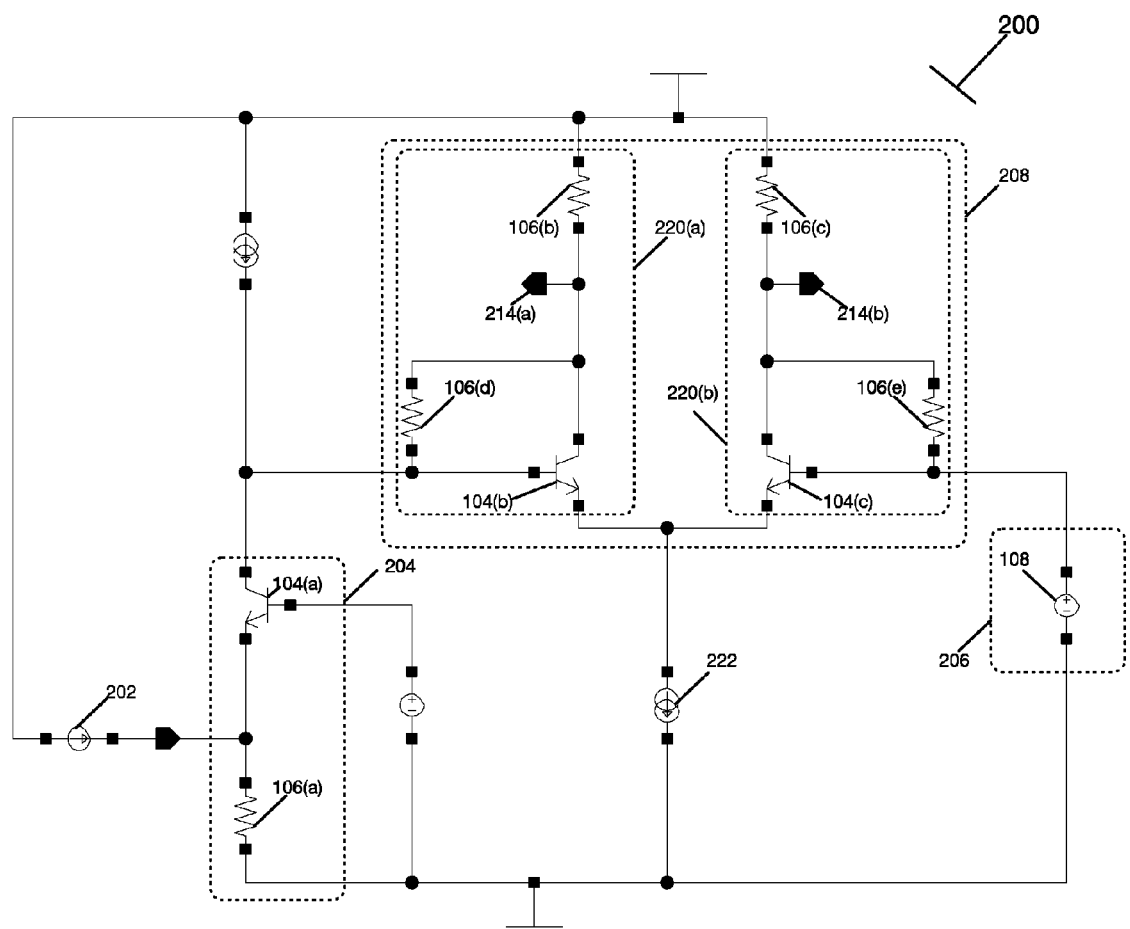
FIG. 2B is a schematic of a balanced differential common emitter transimpedance amplifier with single ended input utilizing an appropriate threshold voltage according to one embodiment.

FIG. 2B is a schematic of a balanced differential common emitter transimpedance amplifier with single ended input utilizing an appropriate threshold voltage according to one embodiment. The embodiment shown in FIG. 2B may be utilized for amplifying a current generated from an optical signal such as that generated by a photodiode (not shown in FIG. 2B). As depicted in FIG. 2B, transimpedance amplifier 200 may be employed to convert a single ended current signal 202 to a differential output voltage at outputs 214a, 214b such as for application in a fiber optic receiver. However, many other applications are possible. The topology depicted in FIG. 2B has several advantages over traditional single ended feedback transimpedance amplifiers as will be described below.

Referring to FIG. 2B, balanced differential transimpedance amplifier 200 comprises differential transimpedance amplifier 208, input current buffer 204 and threshold circuit 206.

According to one embodiment, differential transimpedance amplifier 208 is a differential pair comprising first common emitter 220(a) and second common emitter 220(b). First common emitter 220(a) comprises bipolar transistor 104(b), feedback resistor 106(d) and load resistor 106(b). Second common emitter comprises bipolar transistor 104(c), feedback resistor 106(e) and load resistor 106(c). The two common emitters 104(b) and 104(c) share a single tail current bias source 222 and may operate as either a linear or switching differential pair. The ability of the differential pair (220(a) and 220(b)) to transition to a compressed switching mode removes the traditional limitation on transimpedance gain/maximum input signal level that occurs when a transimpedance amplifier must be maintained in a linear mode of operation.

As referred to herein with respect to the embodiment depicted in FIG. 2B as well as embodiments depicted in FIGS. 3B, 4B, 5B and 6B, the input to common emitter 220(a) at the base of bipolar device 104(b) is referred to as the driven input while the input to common emitter 220(b) at the base bipolar device 104(c) is referred to as the undriven input.

According to the embodiment shown in FIG. 2B, input current buffer 204 is a common base stage. Input current buffer 204 decouples the input source impedance associated with input source 202 from the input impedance of differential transimpedance amplifier 208, which tends to be dominated by the value of feedback resistor 106(d). This employment of input current buffer 204 allows for larger value feedback resistors to be utilized to improve noise limited sensitivity without the usual bandwidth reduction associated with the combination of input shunt capacitances and an increase in input impedance.

Further, according to the embodiment depicted in FIG. 2B, threshold circuit 206 comprises a fixed voltage source 108, which is appropriate to balance the input signal presented at the driven input. This threshold voltage may be derived by a variety of means, including those demonstrated in subsequent embodiments.

Common emitter 220(a) is driven by output of input current buffer 204. On the other hand, common emitter 220(b) is coupled to threshold circuit 206 (undriven input), which in this embodiment provides a fixed voltage threshold 108 to the input of second common emitter 220(b).

In particular, input current signal 202 is provided to input of input current buffer 204 (common base stage). Input current buffer 204 generates an output signal (not shown in FIG. 2B), which is provided to drive the input of common emitter 220(a) at the base of bipolar transistor 104(b). On the other hand, threshold circuit 206 generates a fixed voltage signal via voltage source 108, which is provided to the input (base) of common emitter 220(b).

Differential transimpedance amplifier 208 generates a differential output signal across nodes 214(a) and 214(b) as a function of differential input signals received at the respective bases of bipolar transistors 104(b) and 104(c). In particular, common emitter 220(a) generates an output voltage at output node 214(a) across load resistor 106(b). Similarly, common emitter 220(b) generates an output voltage at output node 214(b) across load resistor 106(c).

In addition to advantages previously described with respect to the topology depicted in FIG. 2B, the transition of the common emitter differential pair from a linear to switching mode of operation allows for increased large signal capabilities, increasing dynamic range. Furthermore, transimpedance amplifier 208 itself handles single ended to differential conversion, which typically requires additional circuitry.

Although FIG. 2B depicts a bipolar implementation, according to alternative embodiments, the schematic shown in FIG. 2B could also be implemented in metal oxide semiconductor ("MOS") technology using a common gate input buffer and differential common drain stage.

In certain applications, input signal 202 may vary over multiple orders of magnitude over the operational dynamic range of the circuit. As the average base voltage of the driven bipolar transistor 104(b) in common emitter 220(a) is directly proportional to the average input current, it is often impractical without proper treatment to use a simple fixed threshold voltage 108 for threshold circuit 206 as depicted in FIG. 2B. In particular, determination of a slicing threshold using a fixed voltage source 108 may result in limited dynamic range and/or significant distortion of the output voltage waveform across differential outputs 214(a) and 214(b).

In order to alleviate this potential behavior, various embodiments, as illustrated in FIGS. 3A-6B, are operational over a wide variation in the expected average input current 202 characterizing the operational dynamic range expected in various applications such as optoelectronics.

According to one approach illustrated in embodiments depicted in FIGS. 3A-4B, a varying decision threshold is generated to ensure a proper slicing over a wide range of input current signal levels.

Figure 5A:
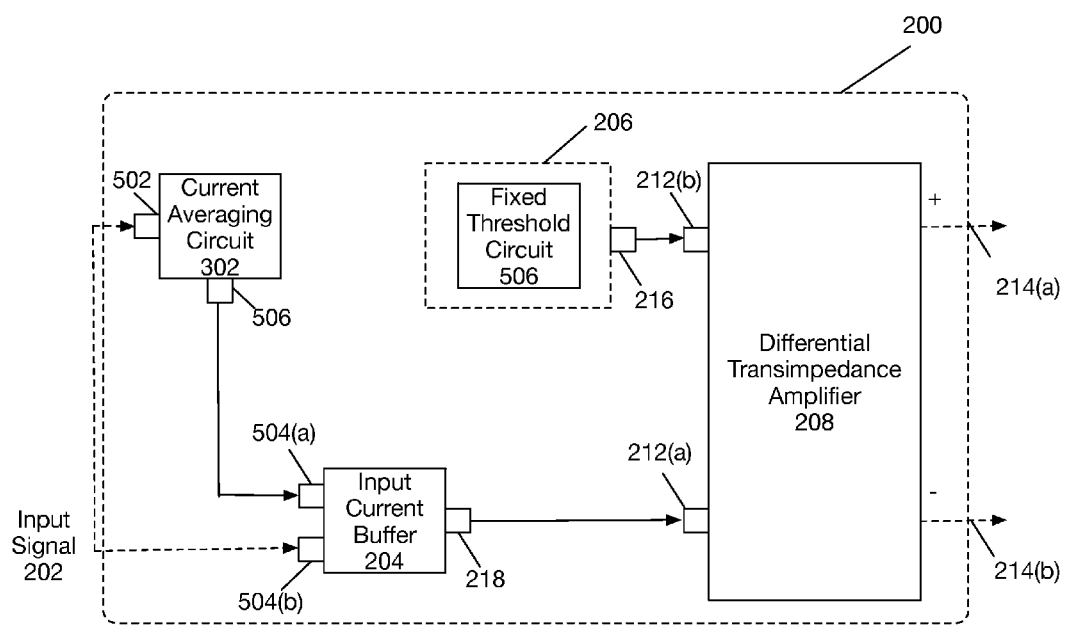
FIG. 5A is a block diagram of a balanced differential transimpedance amplifier with single ended input utilizing a current averaging circuit to control a bias of an input current buffer and a fixed threshold circuit according to one embodiment.
Figure 5B:
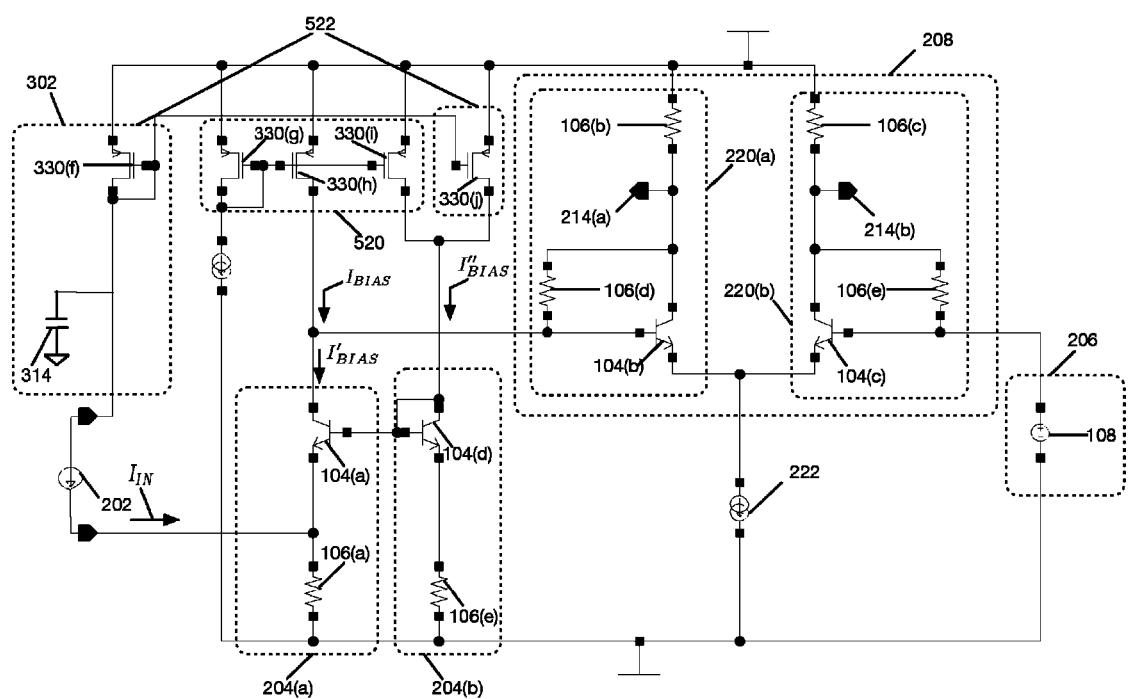
FIG. 5B is a schematic of a balanced differential transimpedance amplifier with single ended input utilizing a current averaging circuit to control a bias of an input current buffer and a fixed threshold circuit according to one embodiment.

According to another approach illustrated in embodiments depicted in FIGS. 5A-5B, a bias current and base voltage of a common base stage are manipulated to cancel out the dependence of the driven common emitter device base voltage on the input current signal levels. This approach may also be applied readily in MOS technology, where analogously a gate voltage of a common source stage could be manipulated to cancel out a dependence of a driven common gate stage.

Figure 6A:
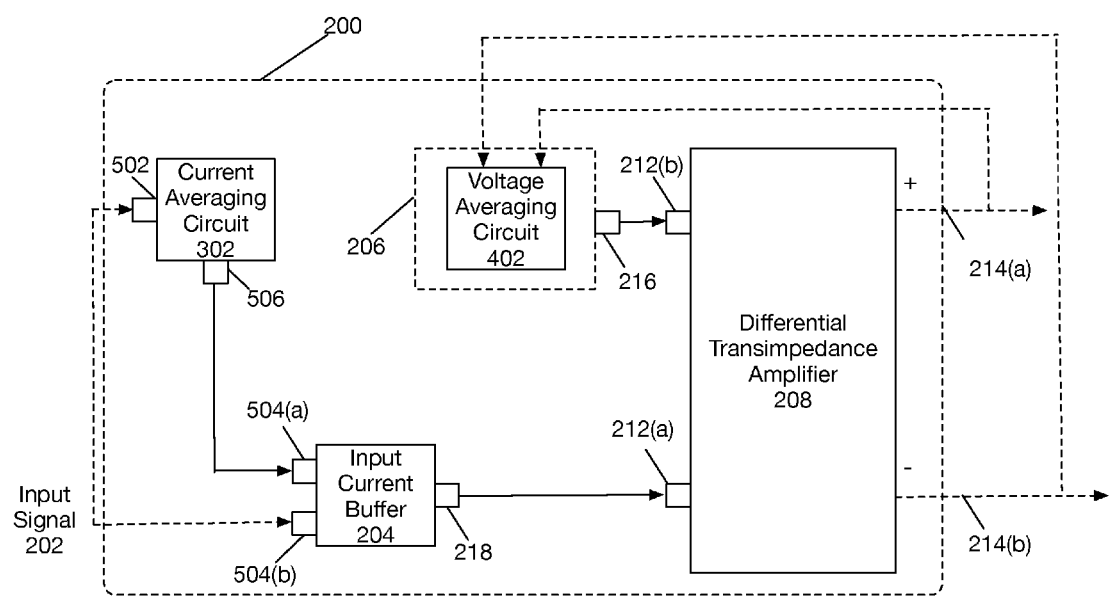
FIG. 6A is a block diagram of a balanced differential transimpedance amplifier with single ended input utilizing both a current averaging circuit to control a bias of an input current buffer and a voltage averaging threshold circuit according to one embodiment.
Figure 6B:
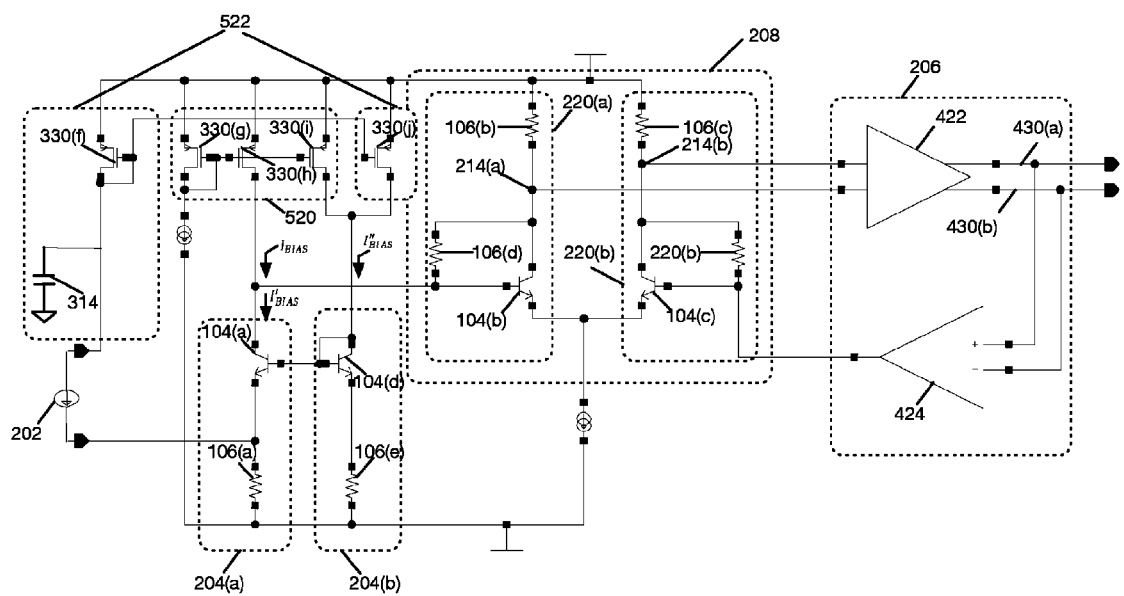
FIG. 6B is a schematic of a balanced differential transimpedance amplifier with single ended input utilizing both utilizing a mirrored replica of a primary common base input buffer to control the bias of the primary input current buffer and a voltage averaging threshold circuit according to one embodiment.

FIGS. 6A-6B illustrate embodiments in which both approaches are simultaneously applied.

Figure 3A:
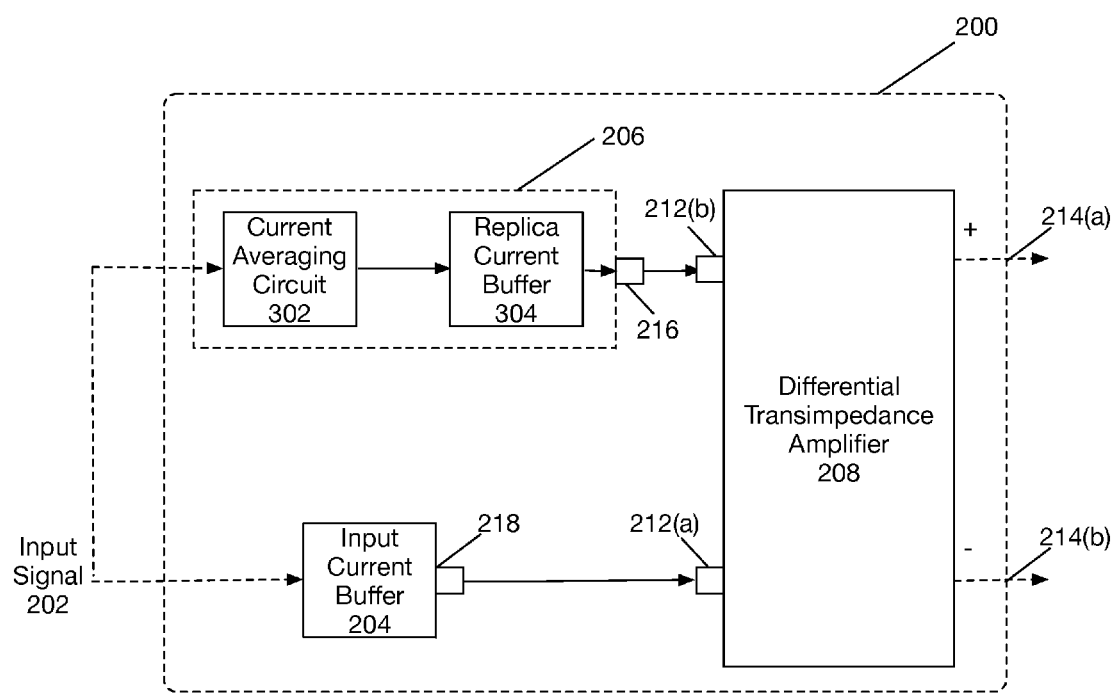
FIG. 3A is a block diagram of a balanced differential transimpedance amplifier with single ended input utilizing a current averaging threshold circuit according to one embodiment.

FIG. 3A is a block diagram of a balanced differential transimpedance amplifier with single ended input utilizing a current averaging threshold circuit according to one embodiment. As depicted in FIG. 3A, balanced differential transimpedance amplifier 200 may comprise input current buffer 204, threshold circuit 206 and differential transimpedance amplifier 208.

In the embodiment depicted in FIG. 3A, threshold circuit 206 comprises current averaging circuit 302 and replica current buffer 304. Input signal 202 is provided to input current buffer 204, which generates an output signal (not shown in FIG. 3A) at input current buffer output 218, which is then provided to differential transimpedance amplifier 208 via input 212(a).

As shown in FIG. 3A, input signal 202 is simultaneously provided to threshold circuit 206 comprising current averaging circuit 302 and replica current buffer 304. According to one embodiment, current averaging circuit 302 may filter input signal 202 to generate a time-averaged DC component of input signal 202 (not shown in FIG. 3A), which is provided to replica current buffer 304. According to one embodiment, replica current buffer 304 is a current buffer with characteristics (and topology) similar or identical to input current buffer 204. Replica current buffer 304 generates an output signal via threshold circuit output 216, which is provided to input 212(b) of differential transimpedance amplifier 208.

Differential transimpedance amplifier 208 operates as previously described with respect to FIG. 2A. In particular, differential transimpedance amplifier 208 receives a differential input signal (not shown in FIG. 2A) via first and second differential inputs 212(a) and 212(b) to generate differential output signal (not shown in FIG. 2A) via differential outputs 214(a) and 214(b).

According to one embodiment, input current buffer 204 and replica current buffer 304 are taken to be identical, and are both presented with the same input current signal 202 either filtered or unfiltered. As such, the inputs to, and consequently the outputs (214(a) and 214(b)) of, differential transimpedance amplifier 208 are inherently balanced resulting in proper operation over a wide range of input current levels.

Figure 3B:
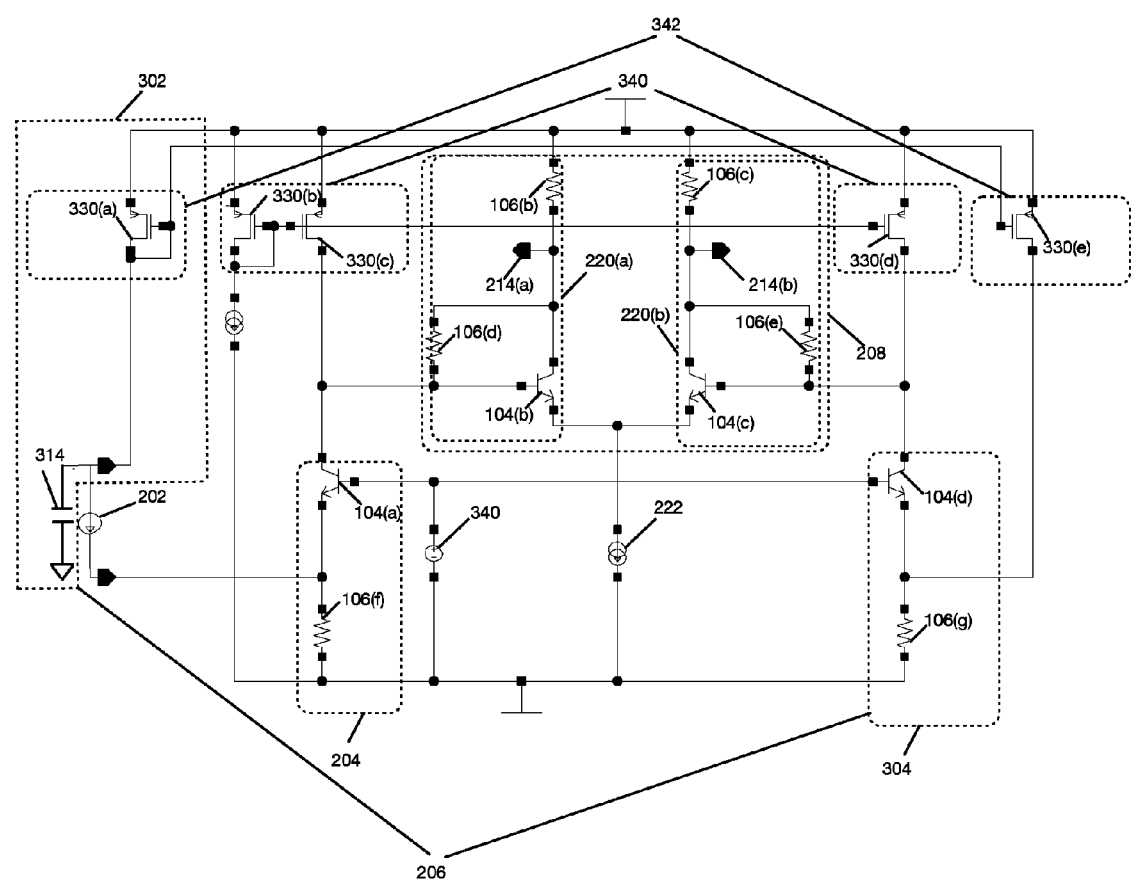
FIG. 3B is a schematic of a balanced differential common emitter transimpedance amplifier with single ended input utilizing a current averaging threshold circuit according to one embodiment.

FIG. 3B is a schematic of a balanced differential common emitter transimpedance amplifier with single ended input utilizing a current averaging threshold circuit according to one embodiment. FIG. 3B shows input current 202, which may be generated, for example, from a photodiode (not shown in FIG. 3B). According to this embodiment, replica common base input stage 304 and a mirrored copy of the average input current (not shown in FIG. 3B) are utilized to generate a threshold voltage at common emitter 220(b) input (undriven) to set a slicing threshold for differential pair 208 that is at the midpoint based upon the input current signal 202.

Referring to FIG. 3B, input current buffer 204 is implemented as what is referred to herein as the "primary common base stage" comprising bipolar transistor 104(a) and resistor 106(f). According to this embodiment a replica current buffer 304 referred to herein as "replica common base stage" is implemented as a common base stage utilizing bipolar transistor 104(d) and resistor 106(g) having equal dimensions and characteristics to the corresponding and respective components of primary common base stage 204(a), namely bipolar transistor 104(a) and resistor 106(f).

Common base stage bias mirror 340 comprising p-channel field emission transistors ("PFETs") 330(b), 330(c) and 330(d) in combination with the shared base voltage of transistors 104(a) and 104(d) causes both primary common base stage 204 and replica common base stage 304 to be biased identically.

FIG. 3B also shows detector current mirror 342 comprising PFETs 330(a) and 330(e). Detector current mirror 342 injects a filtered copy of the DC time average value of the input current into replica common base stage 304.

According to one embodiment the PFETs of detector current mirror 342 are assumed to have a much lower frequency response than the minimum data frequency content of the input current data generated by an input source (not shown in FIG. 3B), which generates input current 202. If this is not the case, the gate/drain of detector current mirror 342 PFET device 330(a) can be capacitively loaded ensuring that the current injected into replica common base stage 204(b) is equal to the DC average value of the input current and that alternating current ("AC") content is sufficiently filtered out.

According to one embodiment, differential transimpedance amplifier 208 is a differential pair comprising first common emitter 220(a) and second common emitter 220(b). First common emitter 220(a) comprises bipolar transistor 104(b), feedback resistor 106(d) and load resistor 106(b). Second common emitter comprises bipolar transistor 104(c), feedback resistor 106(e) and load resistor 106(c).

Assuming that the input data content in the input signal 202, generated for example by a photodiode, is DC balanced, the current into replica common base stage 304 will equal the midpoint of the input current swing provided by current source 202. This will result in balancing of the input signals into both common emitters 220(a) and 220(b) as well as output voltages 214(a) and 214(b). Accordingly, output voltages 214(a) and 214(b) will be symmetric and well balanced for a wide range of input current amplitudes and regardless of whether differential transimpedance amplifier 208 is operating in linear or switching mode.

Although FIG. 3B depicts a bipolar implementation, according to alternative embodiments, the schematic shown in FIG. 3B could also be implemented in MOS technology using a common gate stage, replica common gate stage and differential common source stage.

Figure 4A:
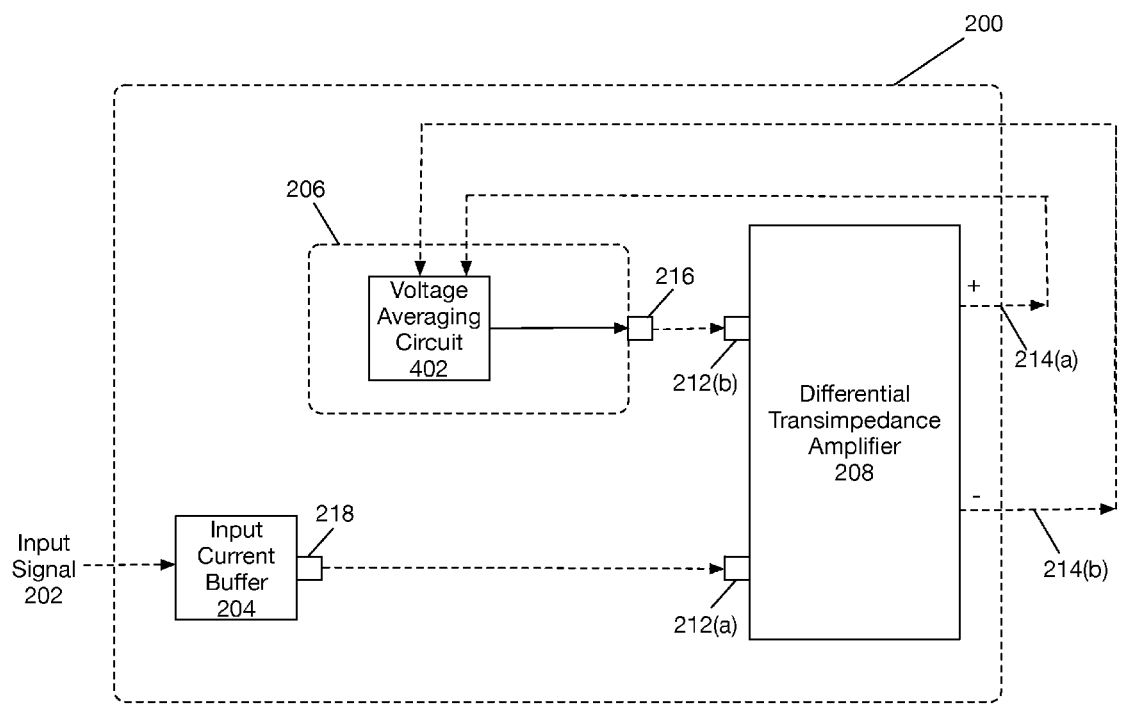
FIG. 4A is a block diagram of a balanced differential transimpedance amplifier with single ended input utilizing a voltage averaging threshold circuit according to one embodiment.

FIG. 4A is a block diagram of a balanced differential transimpedance amplifier with single ended input utilizing a voltage averaging threshold circuit according to one embodiment. As shown in FIG. 4A, balanced differential transimpedance amplifier 200 may comprise input current buffer 204, threshold circuit 206 and differential transimpedance amplifier 208.

Differential transimpedance amplifier 208 operates as previously described with respect to FIG. 2A. In particular, differential transimpedance amplifier 208 receives a differential input signal (not shown in FIG. 4A) via first and second differential inputs 212(a) and 212(b) to generate differential output signal (not shown in FIG. 2A) via differential outputs 214(a) and 214(b).

According to one embodiment, threshold circuit 206 may comprise voltage averaging circuit 402, which allows for generation of an appropriately varying decision threshold to be applied to differential transimpedance amplifier 208 to ensure proper slicing over a wide range of current signal levels. According to one embodiment, voltage averaging circuit 402 performs averaging of differential output signal from transimpedance amplifier 208 received via differential outputs 214(a) and 214(b). An exemplary embodiment and topology for performing voltage averaging is described with respect to FIG. 4B.

Differential output signals 214(a) and 214(b) of differential transimpedance amplifier 208 are provided to voltage averaging circuit 402 in threshold circuit 206. Voltage averaging circuit 402 generates an average voltage signal (not shown in FIG. 4A) at output 216 of threshold circuit 206, which is then provided to input 212(b) of differential transimpedance amplifier 208 thereby establishing an appropriate slicing threshold for amplifying input signal 202.

Input signal 202 is provided to input current buffer 204, which generates an output signal (not shown in FIG. 4A) at output 218, which is then provided to differential transimpedance amplifier 208 via input 212(a).

Figure 4B:
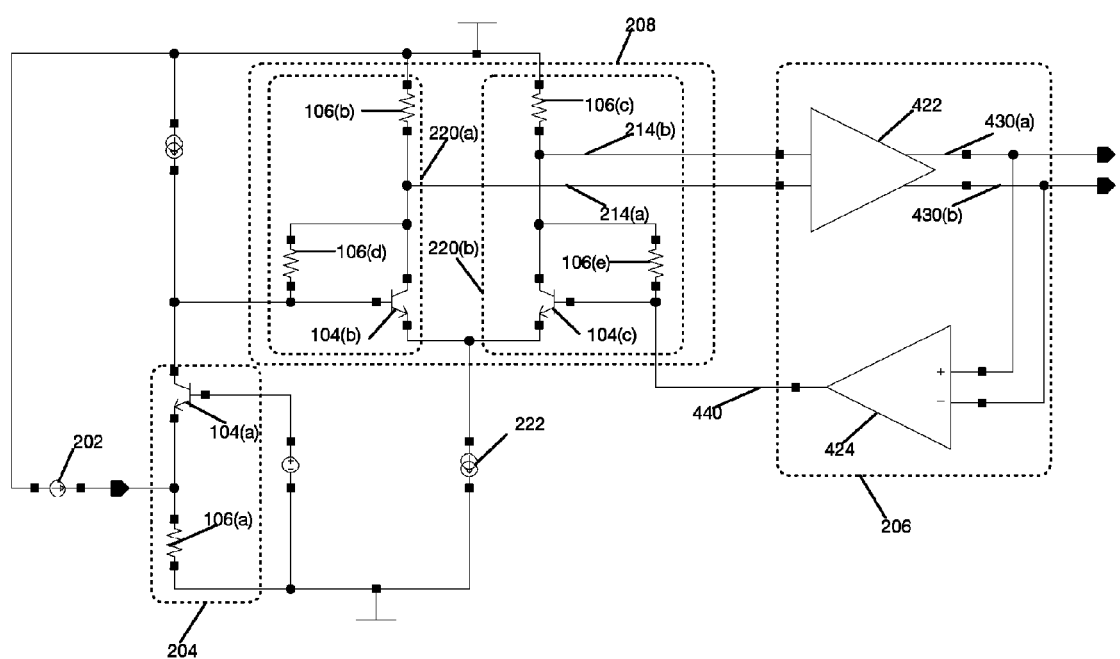
FIG. 4B is a schematic of a balanced differential common emitter transimpedance amplifier with single ended input utilizing a voltage averaging threshold circuit according to one embodiment.

FIG. 4B is a schematic of a balanced differential common emitter transimpedance amplifier with single ended input utilizing a voltage averaging threshold circuit according to one embodiment. As previously described with respect to FIGS. 2B and 3B, differential transimpedance amplifier 208 may be implemented as a differential pair comprising first common emitter 220(a) and second common emitter 220(b). First common emitter 220(a) comprises bipolar transistor 104(b), feedback resistor 106(d) and load resistor 106(b). Second common emitter comprises bipolar transistor 104(c), feedback resistor 106(e) and load resistor 106(c).

As shown in FIG. 4B, threshold circuit 206 generates a variable threshold voltage at the input of common emitter 220(b) (undriven) to maintain a centered slicing level for differential pair 208 over a wide range of input signal levels.

According to one embodiment, threshold circuit 206 comprises one or more amplifiers in a low frequency feedback loop to generate a proper threshold voltage to maintain a balanced output. Specifically, according to the embodiment shown in FIG. 4B, threshold circuit 206 comprises sampling circuit 424 and gain circuit 422. Sampling circuit 424 may comprise a high impedance operational amplifier, which receives a differential input signal and generates a single ended output signal. Optional gain circuit 422 comprises any number of gain stages, which may also be implemented as differential amplifiers, such as may be required to present sampling circuit 424 with sufficient input voltage amplitude to generate an appropriate threshold voltage at the input of common emitter 220(b) (undriven).

If threshold circuit 206 is implemented as one or more operational amplifiers possibly comprising a sampling circuit 424 and a gain circuit 422 as depicted in FIG. 4B, threshold circuit 206 will attempt to create an output voltage that drives the difference between its inputs 214(a), 214(b) to zero. As long as the frequency response of such operational amplifiers comprising threshold circuit 206 is much lower than the minimum data frequency content in input signal 202, threshold circuit 206 will respond only to the DC average value of the time varying voltage signals at its inputs 214(a), 214(b). With this arrangement, threshold circuit 206 comprises a low frequency feedback loop that will create a proper mid-point threshold/slicing voltage for differential pair 208 for a wide range of input current signal levels 202 and input voltages at common emitter 220(a) (driven) input.

FIG. 5A is a block diagram of a balanced differential transimpedance amplifier with single ended input utilizing a current averaging circuit to control a bias of an input current buffer and a fixed threshold circuit according to one embodiment. According to this embodiment current averaging circuit 302 functions as previously described with respect to FIG. 3A, and is arranged with respect to input current buffer 204 so as to cancel any dependence at the input of differential transimpedance amplifier 208 on the amplitude or average value of input signal 202.

In particular, referring to FIG. 5A, input signal 202 is applied to input 502 of current averaging circuit 302, which performs averaging of input signal current 202. Output 506 of current averaging circuit 302 is coupled to input 504(a) of input current buffer. According to one embodiment, input 504(a) may be used to control a bias source associated with input current buffer 204. Output 218 of input current buffer 204 is coupled to input 212(a) of differential transimpedance amplifier 208. Threshold circuit 206 comprises fixed threshold circuit 506, which may be, for example, a constant voltage source.

Input signal 202 is also applied to input 504(b) of input current buffer 204. Based upon the coupling arrangement of current averaging circuit 302 and input current buffer 204 as depicted in FIG. 5A, the input signal (not shown in FIG. 5A) at input 212(a) of differential transimpedance amplifier 208 is rendered independent of variations in the average (common mode) value of input signal current 202.

Insofar as the average value of the input amplitude presented to the driven input 212(a) of differential transimpedance amplifier 208 is rendered independent of the average value of input current 202, the limitations of using a fixed voltage threshold with respect to dynamic range previously discussed with respect to FIGS. 2A and 2B are effectively eliminated.

FIG. 5B is a schematic of a balanced differential transimpedance amplifier with single ended input utilizing a current averaging circuit to control a bias of an input current buffer and a fixed threshold circuit according to one embodiment. The input current 202 as reflected in FIG. 5B is referred to herein as $I_{IN}$. The embodiment shown in FIG. 5B utilizes replica common base stage 204(b) of the primary common base stage 204(a) to control the base voltage/bias of primary common base stage 204(a). In order to maintain a constant average current and output voltage over a wide range of input current 202 levels generated, for example, by a photodiode, an additional current proportional to the DC (or average AC) of input current $I_{IN}$ is added to the bias of replica common base stage 204(b). In particular, according to the embodiment shown in FIG. 5B, replica common base stage 204(b) is biased utilizing both a constant DC component, and a component proportional to the DC average of input current $I_{IN}$, as provided by the current averaging circuit 302. As will be discussed herein, the additional component proportional to the DC average of input current $I_{IN}$ is introduced via detector current mirror 522.

As described previously with respect to FIGS. 2B, 3B and 4B, differential transimpedance amplifier 208 may be implemented as a differential pair comprising first common emitter 220(a) and second common emitter 220(b). First common emitter 220(a) comprises bipolar transistor 104(b), feedback resistor 106(d) and load resistor 106(b). Second common emitter comprises bipolar transistor 104(c), feedback resistor 106(e) and load resistor 106(c).

Primary common base stage 204(a) comprises bipolar transistor 104(a) and resistor 106(a). Replica common base stage 204b comprises bipolar transistor 104(d) and resistor 106(e). Bias mirror 520 comprising PFETs 330(g), 330(h) and 330(i) causes primary common base stage 204(a) and replica common base stage 204(b) to be biased with the same DC current for no input. PFETs 330(h) and 330(i) operate as a mirrored current source. Detector current mirror 522 comprising PFETs 330(f) and 330(j) provides an additional input current proportional to the average DC input current 202 ($I_{IN}$) as generated by current averaging circuit 302 to replica common base stage 204(b). As shown in FIG. 5B, threshold circuit 206 comprises a fixed voltage source 108.

Absent introduction of detector current mirror 522, the average current in bipolar transistor 104(a) in primary common base stage 204(a) would fall according to $I'_{BIAS}=I_{BIAS}-I_{IN}$ for increasing DC or average transient input current. This would result in an increasing portion of the constant current out of mirrored current source 330(h) flowing into input of common emitter 220(a) causing the input voltage to rise. This would result in an imbalance of differential pair 208 unless threshold voltage 108 in threshold circuit 206 were increased to compensate.

In order to compensate for this potential imbalance according to the embodiment depicted in FIG. 5B, an additional current proportional to the DC (or average AC) component of current of $I_{IN}$ is introduced into the bias of replica common base stage 204(b) by introducing detector current mirror 522. Detector current mirror 522 adds to the bias current in bipolar transistor 104(d) of replica common base stage 204(b) as follows:

$$I''_{BIAS}=I_{BIAS}+I_{IN}.$$

Because bipolar transistor 104(d) in replica common base stage 204(b) sets the base voltage of bipolar transistor 104(a) in primary common base stage 204(a), it will attempt to set the current bias in bipolar transistor 104(a) as $I_{BIAS}+I_{IN}$. The operation of detector current mirror 522 and bias mirror 520 is linear and therefore the combined effect is the superposition of the two such that the net current in bipolar transistor 104(a) in primary current buffer stage 204(a) is:

$I'_{BIAS}=I''_{BIAS}-I_{IN}=I_{BIAS}+I_{IN}-I_{IN}=I_{BIAS}$

Thus, introducing detector current mirror 522 causes the average current in bipolar device 104(a) in primary current buffer stage 204(a) to be independent of the DC or AC amplitude of current 202 ($I_{IN}$). Accordingly, the output voltage presented to input of common emitter 220(a) (driven) of differential transimpedance amplifier 208 is also rendered independent of the average input current 202 ($I_{IN}$). This allows a fixed threshold voltage 108 generated by threshold circuit 206 to be utilized at the input to common emitter 220(b) (undriven input) without limiting the dynamic range of the circuit or causing distortion due to a non-centered slicing level eliminating the limitation noted with regards to the embodiments described in FIGS. 2A-2B.

As discussed in regards to FIG. 3B, PFET 330(f) in current averaging circuit 302 is presumed to have a much lower frequency response than the minimum data frequency of the input current signal 202 ($I_{IN}$). If this is not the case, the gate/drain of PFET devices 330(f) in current averaging circuit 302 can be capacitively loaded ensuring that the current injected into replica common base stage 204(b) is equal to the dc average value of input current $I_{IN}$.

Characteristics and dimensions of bipolar device 104(d) and resistor 106(e) in replica common base stage 204(b) may be set to be identical to those of respective corresponding devices 104(a) and 106(a) in primary common base stage 204(a) or can be scaled in equal proportion to produce the same behavior with less overhead current and/or power, provided that PFET devices 330(i) and 330(j) in bias mirror 520 and detector mirror 522 respectively are also scaled in equal proportion relative to 330(h) and 330(f). Although the embodiment depicted in FIG. 5B is implemented using bipolar-complementary MOS ("BICMOS technology, it could also be implemented using complementary MOS ("CMOS") or only bipolar devices.

FIG. 6A is a block diagram of a balanced differential transimpedance amplifier with single ended input utilizing both a current averaging circuit 302 to control a bias of an input current buffer 204 and a voltage averaging threshold circuit 402 according to one embodiment. Combining both a current averaging circuit 302 and voltage averaging circuit 402 provides the advantages of maintaining a precise threshold voltage/slicing level in the presence of non-ideal devices and also reduces the tracking range requirements on the operational amplifier loop. These advantages will become clear with respect to FIG. 6B and associated description.

In particular, referring to FIG. 6A, input signal 202 is applied to input 502 of current averaging circuit 302, which performs averaging of input signal current 202. Output 506 of current averaging circuit 302 is coupled to input 504(a) of input current buffer 204. According to one embodiment, input 504(a) may be used to control a bias signal associated with input current buffer 204. Output 218 of input current buffer 204 is coupled to input 212(a) of differential transimpedance amplifier 208.

Threshold circuit 206 comprises voltage averaging circuit 402, which allows for generation of an appropriately varying decision threshold to be applied to differential transimpedance amplifier 208 to ensure proper slicing over a wide range of current signal levels. According to one embodiment, voltage averaging circuit 402 performs averaging of differential output signal from transimpedance amplifier 208 received via differential outputs 214(a) and 214(b). An exemplary topology for performing voltage averaging is depicted in FIG. 4B.

Differential output signals 214(a) and 214(b) of differential transimpedance amplifier 208 are provided to voltage averaging circuit 402 in threshold circuit 206. Voltage averaging circuit 402 generates an average voltage signal (not shown in FIG. 4A) at output 216 of threshold circuit 206, which is then provided to input 212(b) of differential transimpedance amplifier 208 thereby establishing an appropriate slicing threshold for amplifying input signal 202.

Input signal 202 is also applied to input 504(b) of input current buffer 204. Based upon the coupling arrangement of voltage averaging circuit 402 and input current buffer 204 as depicted in FIG. 6A, the input signal (not shown in FIG. 6A) at input 212(a) of differential transimpedance amplifier 208 is rendered independent from variations in the average (common mode) value of input signal current 202.

FIG. 6B is a schematic of a balanced differential transimpedance amplifier with single ended input utilizing both utilizing a mirrored replica of a primary common base input buffer to control the bias of the primary input current buffer and a voltage averaging threshold circuit according to one embodiment. In particular, the embodiment depicted in FIG. 6B combines a mirrored replica of a common base buffer stage to minimize the voltage variation with respect to input current level similar to the embodiment described with respect to FIG. 5B. In addition, the embodiment depicted in FIG. 6B employs an operational amplifier low frequency feedback loop to generate the proper threshold voltage/slicing level in the presence of non-ideal devices similar to the embodiment shown and described with respect to FIG. 4B.

Similar to the embodiment shown in FIG. 5B, the embodiment depicted in FIG. 6B utilizes replica common base stage 204(b) of the primary common base stage 204(a) to control the base voltage/bias of primary common base stage 204(a). In order to maintain a constant average current and output voltage over a wide range of input current 202 levels generated, for example, by a photodiode, replica common base stage 204(b) is biased both utilizing a constant DC component, and a component proportional to the DC average of input current, as provided by the current averaging circuit 302.

In addition, similar to the embodiment depicted in FIG. 4B, the embodiment depicted in FIG. 6B employs threshold circuit 206, which generates a variable threshold voltage at the input of common emitter 220(b) (undriven) to maintain a centered slicing level for differential pair 208 over a wide range of input signal levels.

According to one embodiment, threshold circuit 206 comprises one or more amplifiers in a low frequency feedback loop to generate a proper threshold voltage to maintain a balanced output. Specifically, similar to the embodiment shown in FIG. 4B, threshold circuit 206 of FIG. 6B may comprise sampling circuit 424 and gain circuit 422. Sampling circuit 424 may comprise a high impedance operational amplifier, which receives a differential input signal and generates a single ended output signal. Optional gain circuit 422 comprises any number of gain stages, which may also be implemented as differential amplifiers, such as may be required to present sampling circuit 424 with sufficient input voltage amplitude to generate an appropriate threshold voltage at the input of common emitter 220(b) (undriven).

While the present invention has been particularly shown and described with reference to the preferred mode as illustrated in the drawing, it will be understood by one skilled in the art that various changes in detail may be effected therein without departing from the spirit and scope of the invention as defined by the claims.

What is claimed is:

1. A balanced differential transimpedance amplifier with single ended input comprising:
   a) a differential transimpedance stage, the differential transimpedance stage further comprising a first input and a second input;
   b) an input current buffer stage, wherein an output of the input current buffer stage is coupled to the first input of the transimpedance stage; and
   c) a threshold circuit for generating a threshold voltage for balancing the differential transimpedance stage, wherein an output of the threshold circuit is coupled to the second input of the transimpedance stage, wherein the threshold circuit receives at least one input signal and performs an averaging operation on the at least one input signal to generate the output of the threshold circuit.

2. The balanced differential transimpedance amplifier according to claim 1, wherein the threshold voltage is a fixed voltage.

3. A balanced differential transimpedance amplifier with single-ended input comprising:
   a) a differential transimpedance stage, the differential transimpedance stage further comprising a first input and a second input;
   b) an input current buffer stage, wherein an output of the input current buffer stage is coupled to the first input of the transimpedance stage; and
   c) a threshold circuit for generating a threshold voltage for balancing the differential transimpedance stage, wherein an output of the threshold circuit is coupled to the second input of the transimpedance stage, wherein the input current buffer stage is one of a common base stage and common gate stage.

4. The balanced differential transimpedance amplifier according to claim 1, wherein the differential pair comprises one of a common emitter and common source differential pair.

5. A balanced differential transimpedance amplifier with single-ended input comprising:
   a) a differential transimpedance stage, the differential transimpedance stage further comprising a first input and a second input;
   b) an input current buffer stage, wherein an output of the input current buffer stage is coupled to the first input of the transimpedance stage; and
   c) a threshold circuit for generating a threshold voltage for balancing the differential transimpedance stage, wherein an output of the threshold circuit is coupled to the second input of the transimpedance stage, wherein the input current buffer stage is arranged so as to decouple a resistance associated with the differential transimpedance stage and a capacitance associated with an input current source.

6. A balanced differential transimpedance amplifier with single-ended input comprising:
   a) a differential transimpedance stage, the differential transimpedance stage further comprising a first input and a second input;
   b) an input current buffer stage, wherein an output of the input current buffer stage is coupled to the first input of the transimpedance stage; and
   c) a threshold circuit for generating a threshold voltage for balancing the differential transimpedance stage, wherein an output of the threshold circuit is coupled to the second input of the transimpedance stage, wherein the threshold circuit further comprises an averaging circuit and a replica current buffer, the averaging circuit is coupled in series with the replica current buffer, and the replica current buffer is coupled in series with the second input of the transimpedance stage.

7. The balanced differential amplifier according to claim 6, wherein the current averaging circuit receives an input signal and generates a DC time averaged signal as a function of the input signal.

8. A balanced differential transimpedance amplifier with single ended input comprising:
   a) a transimpedance stage comprising a differential pair, the differential pair further comprising a first input, a second input, a first output and a second output;
   b) an input current buffer stage, wherein an output of the input current buffer stage is coupled to the first input of the transimpedance stage; and
   c) a threshold circuit further comprising a voltage averaging circuit, wherein an output of the voltage averaging circuit is coupled to the second input of the transimpedance stage and the first and second outputs of the transimpedance stage are coupled to respective first and second inputs of the voltage averaging circuit.

9. The balanced differential transimpedance amplifier according to claim 8, wherein the voltage averaging circuit further comprises a sampling circuit and a gain circuit.

10. The balanced differential transimpedance amplifier according to claim 9, wherein the sampling circuit comprises a high impedance operational amplifier, which receives a differential input signal and generates a singled ended output signal.

11. The balanced differential transimpedance amplifier according to claim 9, wherein the gain circuit comprises a plurality of gain stages implemented as differential amplifiers.

12. The balanced differential transimpedance amplifier according to claim 8, wherein the differential pair comprises a common emitter differential pair.

13. The balanced transimpedance amplifier according to claim 8, wherein the input current buffer stage is arranged so as to decouple a resistance associated with the differential transimpedance stage and a capacitance associated with an input current source.

14. A balanced differential transimpedance amplifier with singled ended input comprising:
   a) a transimpedance stage comprising a differential pair, the differential pair further comprising a first input and a second input;
   b) an input current buffer comprising a first input and a second input, wherein an input current source is coupled to the first input of the input current buffer and an output of the input current buffer is coupled to the first input of the transimpedance stage;
   c) a current averaging circuit coupled in series between the input current source and the second input of the input current buffer, wherein the current averaging circuit receives the input current source and generates a DC time averaged signal based upon the input current source; and d) a threshold circuit, wherein an output of the threshold circuit is coupled to the second input of the transimpedance stage.

15. The balanced differential transimpedance amplifier according to claim 14, wherein the threshold circuit is a fixed threshold circuit.

16. The balanced differential transimpedance amplifier according to claim 14, wherein the threshold circuit is a voltage averaging circuit.

17. The balanced differential transimpedance amplifier according to claim 16, wherein the voltage averaging circuit receives a first and second voltage outputs of the transimpedance stage and generates an average voltage signal based upon the first and second voltage outputs.

18. The balanced differential transimpedance amplifier according to claim 14, wherein the differential pair is one of a common emittance differential pair and a common source differential pair.

19. The balanced transimpedance amplifier according to claim 14, wherein the current buffer stage is arranged so as to decouple a resistance associated with the transimpedance stage and a capacitance associated with the input source.

20. A balanced differential transimpedance amplifier with single-ended input comprising:

a) a differential transimpedance stage, the differential transimpedance stage further comprising a first input and a second input;

b) an input current buffer stage, wherein an output of the input current buffer stage is coupled to the first input of the transimpedance stage; and c) a threshold circuit for generating a threshold voltage for balancing the differential transimpedance stage, wherein an output of the threshold circuit is coupled to the second input of the transimpedance stage, wherein the input current buffer comprises a current source coupled in series with a transistor and resistor between upper and lower voltage rails.

21. The balanced transimpedance amplifier according to claim 8, wherein the input current buffer comprises a current source coupled in series with a transistor and resistor between upper and lower voltage rails.

\* \* \* \* \*